United States Patent [19]

Gupta

[11] Patent Number: 6,045,857
[45] Date of Patent: Apr. 4, 2000

[54] CURABLE, WATER-BORNE ONE-COMPONENT COATING SYSTEM USING THERMALLY LABILE HYDROPHILLIC GROUPS

[75] Inventor: Goutam Gupta, Acworth, Ga.

[73] Assignee: MacDermid Acumen, Inc., Dover, Del.

[21] Appl. No.: 08/878,663

[22] Filed: Jun. 19, 1997

[51] Int. Cl.⁷ ........................................................ B05D 5/12
[52] U.S. Cl. ..................... 427/96; 430/286.1; 430/287.1; 430/312; 523/404; 523/414; 523/428; 523/429; 525/531; 525/533; 528/114; 528/118
[58] Field of Search .............................. 430/280.1, 281.1, 430/286.1, 287.1, 311, 312; 523/404, 414, 428, 429; 528/114, 118; 525/531, 533; 427/96, 18, 120

[56] References Cited

U.S. PATENT DOCUMENTS

| | | |
|---|---|---|
| 2,719,178 | 9/1955 | Coover et al. . |
| 3,925,349 | 12/1975 | Gaske ................................. 204/159.15 |
| 4,101,398 | 7/1978 | Hesse et al. . |
| 4,147,603 | 4/1979 | Pacifici et al. ..................... 204/159.12 |
| 4,162,274 | 7/1979 | Rosenkranz et al. . |
| 4,358,477 | 11/1982 | Noomen et al. . |
| 4,428,807 | 1/1984 | Lee et al. . |
| 4,479,983 | 10/1984 | Appelt et al. . |

FOREIGN PATENT DOCUMENTS

| | | |
|---|---|---|
| 0 399 350 | 5/1990 | European Pat. Off. . |
| 0450875 | 10/1991 | European Pat. Off. . |
| 49-040395 | 4/1974 | Japan . |

OTHER PUBLICATIONS

Johnson, J. Org. Chem. (1986) 51(6), pp. 833–837, 1986.

*Primary Examiner*—Robert Dawson
*Assistant Examiner*—D. Aylward
*Attorney, Agent, or Firm*—Valerie E. Looper

[57] ABSTRACT

Unsaturated hydrophobic resins modified with labile hydrophillic groups exhibit reversible solubility in water. Beta-dialkyl amino carboxylate derivatives of novolak resins are useful to make baking enamels and resists.

27 Claims, No Drawings

സ6,045,857

CURABLE, WATER-BORNE ONE-COMPONENT COATING SYSTEM USING THERMALLY LABILE HYDROPHILLIC GROUPS

FIELD OF THE INVENTION

The present invention relates generally to the field of waterborne, water-removable compositions that are curable by heat or ultraviolet light, and are generally useful as formaldehyde-free baking enamels and also as photoimageable compositions in the manufacture of printed circuit boards. More specifically, it relates to coating compositions based on hydrophobic resins modified to have labile hydrophillic groups, especially those which have reversible acrylate unsaturation. Such materials have reversible water dispersibility and may have reversible water solubility.

BACKGROUND OF THE INVENTION

Curable coating compositions have wide application in number of fields, as they are useful for protecting various kinds of surfaces from severe chemical and physical environments. A baking enamel, for example, may be applied to an object and then heated to form a tough, chemical-and-light resistant coating. Such a material needs to have at least one form of cure such as UV or thermal cure. A coating for an object that does not have a smooth surface, such as a conformal coating, may profit from use of dual cure methods, such as UV cure step followed by a thermal cure step. The UV cure step can provide a quick cure so that the coating is dry to the touch and the object can be handled, and the thermal cure can then proceed to harden the coating in shadowed areas.

A more elaborate process is needed where it is desirable to coat only part of an object's surface. A solder mask, for example, is a permanent coating for a printed circuit board that must not cover certain parts of the circuitry on the board such as the contact points. A UV-curable solder mask is applied as a coating to the entire board, and then exposed to ultraviolet light through a pattern, or image. Where the light falls on the coating, the coating hardens, or cures. The portions that are not exposed to the light remain unhardened and are washed away in a developer solution. Sometimes it is desirable to further treat the solder mask to toughen it. In that case, the coating might be baked to further improve its chemical, heat, and moisture resistance.

The situation may be even more complicated where a temporary, partial coating is desired. A primary photoresist, for example, is a temporary coating used in a photographic-style process to prepare the circuitry on a printed circuit board. The primary photoresist is applied as a coating to an object which is a substrate laminated with a layer of copper. The coated object is then exposed to ultraviolet light through a pattern, or image. The exposed portion of the coating hardens, or cures in response to the light, and becomes resistant to a developer solution. The unexposed portions remain unhardened and are washed away by the developer solution, thereby uncovering portions of the copper layer. The unprotected portions of the copper layer are then removed in an etch bath, leaving the substrate uncovered in some areas, and covered by a layer of copper-plus-resist in others. Next, the resist layer is stripped from the copper, leaving the substrate with a copper circuit pattern on it. The various steps of imaging, developing, and etching must be exquisitely precise to meet the ever-increasing demands for fine, error-free lines.

Materials which are useful in the above-described processes are well known, and are available as formulations that contain and are developable in solvents made of volatile organic compounds (VOCs). VOCs, however, have been identified as pollutants and have been targeted by a variety of regulations aimed at reducing their use. Accordingly, efforts have been directed toward obtaining coating materials that can be formulated in water (or, are waterborne) and are water-developable.

One technique for rendering a coating material water developable is to add acidic functional groups to an organic molecule that is otherwise known to yield good physical properties when formulated as a coating. For example, certain commercially available formulations use polymers modified to incorporate significant amounts of carboxylic acid functional groups in order to confer water dispersibility on an otherwise hydrophobic molecule. Such coatings are typically developable in alkaline water (1% carbonate) solutions. Once the coating is applied, imaged and developed, however, any acid groups remaining in the coating need to be destroyed or treated to improve the coating's chemical and humidity resistance as well as to reduce corrosion and ionic permeability for better electrical insulation properties. In addition, since the coatings are developed with alkaline water, the used developer solution needs to be neutralized and treated before disposal, adding to the environmental processing load. Further, these formulations also typically include additives with epoxy functional groups in order to allow thermal curability. Epoxy groups and carboxylic acid groups react with one another. As a result, the epoxy and the acid portions of the formulation have to be mixed and used within a limited period of time, on the order of hours to, at most, several days.

A coating system that is truly developable in water as opposed to alkaline water, which relies on little or no VOC content in its formulation, and which can be UV curable, thermally curable, or both, would be particularly valuable for use in one part, curable coatings and sealants, as well as resists and solder masks.

The inventor has found that such a coating system can be made using oligomers having acrylate and/or latent acrylate unsaturation. Such oligomers have labile hydrophillic groups and can be reversibly converted from water soluble to water insoluble forms. The stable, water soluble form is converted under mild heat to a water insoluble form that is photo- or heat- curable.

SUMMARY OF THE INVENTION

It is an object of the present invention to provide a method of solubilizing hydrophobic resins through incorporation of labile hydrophilic groups. Another object of this invention is to reversibly solubilize hydrophobic resins in water by incorporating thermally unstable hydrophillic functional groups. A further object of this invention is to provide waterborne, one part, stable, very low VOC compositions that are curable by UV or heat or both. It is yet a further object of this invention to provide a curable coating system that is tunable with respect to the type and timing of cure: that is, UV curable, or heat curable, or both, wherein the conditions for cure are different enough to allow the user to obtain the two cures as separate steps. Yet another object of this invention is to provide a water-borne, one-part, single or dual curable, formaldehyde-free baking enamel.

The present inventor has found that thermally labile hydrophillic groups can be incorporated into hydrophobic resins to impart water solubility, and then subjected to typical temperatures used for thermal cure, about 300° F. (150° C.) to convert the resin back to hydrophobic form. The hydrophobic resins are any of those typically used to make curable coatings, preferably unsaturated resins, and more preferably are acrylated resins. The labile hydrophillic groups are those which can be introduced into a hydrophobic resin at suitable reactive sites on the polymer, such as unsaturated sites or epoxy functional sites, under convenient conditions, such as mild warming and acid, to produce a water soluble derivative. This can be done by reacting a suitable derivative incorporating both a hydrophillic group and also an attachment group, which must be reactive with the reactive site on the polymer. The nature of the attachment group depends upon the reactive site; where the reactive site is, for example, an acrylic unsaturatiion, the attachment group can be an amine or similar nucleophilic group. Where the reactive site is an epoxy group, the attachment group can preferably be a carboxylic acid or an amine. Where the reactive site on the polymer is an amine or other nucleophilic group, the attachment group is preferably an acrylic unsaturation or an epoxy group; where the reactive site is an amine, the attachment group is preferably an epoxy group. Under special circumstances, an attachment group can also have hydrophillic character, which will allow a single functional group to serve both purposes. The labile hydrophillic groups include amine oxides, hydroxides derived from quaternary ammonium, phosphonium and sulfonium salts, and beta-carboxy alkyl di- or tri-alkylamines or their salts.

A curable, hydrophobic resin suitable for use as a coating can be reacted through its unsaturated groups to introduce hydrophillic groups, thereby producing a stable, water soluble resin. The water soluble resin can then be formulated as a one-part coating composition with typical additives such as initiators, inhibitors, terminators, pigments, dyes, and rheology aids.

The formulation can be coated on an object, and dried to a tack-free state. Upon mild heating, the original resin and and its reactive, unsaturated groups are regenerated. The original resin is now curable, and vulnerable to any initiators or other reactive components included in the formulation. An advantage of the present invention is that the resin does not inherently contain acid groups after cure. Imageable coatings prepared according to the present invention are developable in water, as opposed to alkaline water. Another advantage of the present invention is that the coating can be made and stored as a single-component, rather than a two-component system, thereby simplifying both the packaging process as well as the process by which the coating is used.

Where fewer than all of the unsaturated grops are modified by the hydrophillic groups, the resin may still be water soluble or water dispersible, and yet remain curable. Such resins may be especially useful where, for example, two separate curing steps are desirable.

These and other objects and advantages of the present invention will become apparent through the text and examples herein.

DETAILED DESCRIPTION OF THE INVENTION

The hydrophobic resins used in the present invention are any of the acrylated resins known to the coatings art. These include polymers, oligomers, copolymers and resins having acrylic or methacrylic functionality. Suitable unsaturated monocarboxylic acids, and unsaturated monomers and oligomers are described in U.S. Pat. No. 4,428,807 issued to Lee et al. Jan. 31, 1984; polethylenically unsaturated compounds are discussed in U.S. Pat. No. 4,479,983, issued to Appelt et al. Oct. 30, 1984: both references are incorporated herein by reference as if set forth in full.

As used herein, the terms "acrylic" or "acrylate" or "acrylated" are intended to cover both the acrylic and methacrylic forms. Preferred resins include acrylic monomers, oligomers, polymers and copolymers, acrylated styrene maleic anhydride copolymers, and acrylated urethane, polyether, polyester, and epoxy resins, such as aliphatic, cycloaliphatic and SMA epoxy resins, as well as acrylated epoxy bisphenol-A epoxy resins, epoxy phenol novolaks and acrylated epoxy cresol novolaks. Epoxy resins are disclosed in U.S. Pat. No. 4,101,398 issued to Hesse et al. Jul. 18, 1978; in U.S. Pat. No. 4,162,274 issued to Rosencranz Jul. 24, 1979; in U.S. Pat. No. 4,428,807 issued to Lee et al. Jan. 31, 1984, in U.S. Pat. No. 4,479,983 issued to Appelt et al. Oct. 30, 1984; and in U.S. Pat. No. 4,358,477 issued to Noomen et al. Nov. 9, 1982. Each of these references is incorporated herein as if set forth in full.

Acrylate esters such as derivatives of phenyl- and cresol-novolaks are preferred. These resins are modified by the addition of hydrophillic groups. The hydrophillic groups are those which are capable of reacting with the acrylate groups in the resin, and then changing their state upon the addition of heat, preferably upon exposure to temperatures typically suitable for thermal cure, about 120–260° C. (155–400° F.), perferably about 150–165° C. (300–325° F.). These include amine oxides, hydroxides derived from quaternary ammonium, phosphonium and sulfonium salts, and beta-carboxy alkyl di- or tri-alkylamines or their salts. Of these, beta-carboxy alkyl di- or tri-alkylamines or their salts and amine oxides are preferred.

To produce a preferred water soluble resin, an acrylate ester is reacted with a secondary amine in a nucleophilic addition process and then neutralized with acid. The resulting beta-dialkylaminocarboxylate salt can readily undergo thermal elimination upon exposure to heat. When it does, the original acrylic group is re-formed and is easily crosslinked (cured) through an oxidative process or incorporation of a free radical initiator if appropriate.

In many cases, it will not be necessary to modify all of the hydrophobic resin's unsaturated groups with the hydrophillic groups in order to obtain a water-soluble resin. In some cases, the resin need not be converted to full water solubility because water dispersibility will be sufficient for a given purpose. Where a significant fraction of the hydrophobic resin's unsaturated groups remain unreacted with the hydrophillic groups, the resulting partially converted resin can be both water soluble (or dispersible) and curable. These resins can be formulated into very-low-VOC compositions which, when photoimaged, are water-developable, and can have two distinct cure steps, such as a UV cure of the existing, unreacted, unsaturated groups followed by thermal regeneration of the unsaturated groups that were reacted with the hydrophillic groups. These regenerated groups may then be cured by any known method, such as heat or UV treatment.

Generally, at least about 20–25% of the hydrophobic resin's unsaturated groups will need to be modified with the hydrophillic groups to obtain water solubility, while a lower amount of about 1–20% is needed to obtain water dispersibility. The ability to obtain water dispersibility or solubility and the potential separation of cure steps present the material or process designer with a broad opportunity to tailor both the manufacturing process and the end product to specific uses.

The water soluble resin can be formulated with any of the usual additives found in curable compositions, such as initiators, terminators, pigments, dyes, rheology aids and other physical property enhancers. These materials are well known to those of ordinary skill in the art.

For example, photoinitiators are disclosed in U.S. Pat. No. 4,162,274, issued to Rosencranz Jul. 24, 1979, and U.S. Pat. No. 4,479,983 issued to Appelt et al. Oct. 30, 1984; inhibitors or terminators are discussed in U.S. Pat. No. 4,162,274 issued to Rosencranz; all of which are incorporated herein by reference as if set forth in full.

The following Examples are presented for the purpose of illustrating the practice of the present invention. They do not limit the invention, or the claims which follow.

The following methods were used in the Examples:

Preparation of Amine-modified Acrylated Epoxynovolaks (Epon 164) using secondary amines: To 0.1 mole of acrylic acid and 20 mg phenothiazine in 27 ml of 2-methoxy-1-propanol(PM) was added 0.1–0.025 moles of secondary amine as appropriate, dissolved in an addition 27 ml of PM. After the initial small exotherm, the mixture was allowed to stir a 20° C. for 1 hour followed by an additional hour at 85° C. Evaporation of PM from a small sample followed by examination by NMR showed the expected reduction or elimination of the vinyl protons of acrylic acid, accompanied by the formation of new absorptions attributed to the methylene protons adjacent to the amines, carboxyls and the oxygens as appropriate. The carbonyl absorption of the acrylic acid at 1690 $cm^{-1}$ was shifted to 1727-35 $cm^{-1}$ in the IR. At the end of the heating, Epon 164 (Epoxy Cresol Novolak, 20.7 g, 0.09 mole equiv. epoxy content) was added and dissolved with stirring. The heating was continued for an additional 4 hours or until the epoxy absorption of the mixture became minimized. The resulting yellow, viscous solutions were stored at ambient temperature and used directly for drying and crosslinking evaluations.

Other solubilizing groups besides beta-carboxy alkyl di- or tri-alkylamines or their salts can be used. In the synthesis described below, Diethanolamine is reacted with maleic anhydride to prepare an adduct. The adduct is then acidified and reacted with an epoxy novolak. The resulting modified epoxy novolak is then oxidized through its amine group with a peroxide, to demonstrate a method of making an amine oxide solubilizing group.

Preparation of the Maleic Anhydride adduct of Dimethylaminoethanol (DMEA-MA): To a 1 L 3-neck round bottom flask equipped with mechanical stirrer and dropping funnels, 34.14 g(0.3482 moles) of maleic anhydride was dissolved in 200 ml ethyl acetate. 34.045 g (.3482 moles) of dimethylethanolamine (DMEA) dissolved in 50 ml of ethyl acetate was added dropwise to the solution over 10 minutes with vigorous stirring followed by 1 additional hour of stirring at room temperature and heating at reflux for 1 hour. After cooling to room temperature, the precipitated solid was filtered, washed with ethyl acetate and air dried to yield 57.44 g (88.12%) of the adduct.

Preparation of mixed DMEA-MA/Acrylic acid adducts of Epoxynovolak (Epon 164 resin): 2.33 g (0.0125 mole) DMEA-MA (50% in PM), 2.7 g(0.0375 moles of acrylic acid, 0.0253 g (1.27×$10^{-4}$ mole) phenothiazine and 16.05 g of 1-Methoxy-2-propanol (PM) were combined in a 100 ml 3-neck flask equipped with magnetic stirrer, reflux condenser and a thermocouple from a Thermowatch temperature controller. After mixing at ambient temperature for 10 minutes, the mixture was heated to 85° C. and 11 g (0.05 equivalent epoxy) of Epon 164 resin was added to the mixture in one shot. As the Epon 164 resin dissolved, an exotherm ensued, resulting in a homogenous mixture. The mixture was stirred at 85° C. for an additional hour, when it was cooled to ambient temperature to yield 29.94 g of light yellow, viscous solution. IR indicated disappearance of the amino carbonyl absorption replaced by that of saturated aliphatic ester carbonyl.

The above procedure is for 1:1 epoxy:carbonyl stoichiometry with the carboxyl from a mixture of DMEA-MA/Acrylic acid in a 75:25 ratio. An identical procedure was used with appropriate amounts of DMEA-MA/Acrylic Acid to prepare similar resins at 100:0, 75:25 50:50, 25:75 and 10:90 DMEA-MA/Acrylic carboxyl ratios.

Oxidation of DMEA-MA-Acrylic-Epon 164 adducts to amine oxides: 16.4 g of the adduct (50% in PM, Aminoacid:Acrylic Acid 1:1, 0.026 mole equiv. amine) and 25 mg phenothiazine was placed in a 100 ml 3. neck flask equipped with magnetic stirrer, thermocouple from a temperature controller, and a reflux condenser and cooled to 10° C. in an ice bath. 2.35 g (0.026 mile) of t-Butylhydroperoxide was added to the mixture dropwise with vigorous stirring. After the addition was complete, the orange-yellow mixture was warmed to ambient temperature and then gradually heated to 90° C., during which time the color of the mixture turned red. After holding at 90° C. for 1 hour, the mixture was cooled to ambient temperature and tested negative for peroxide with acidified starch-iodide paper. IR showed no significantly different change of absorption from the starting resin and was used for evaluation as is.

Evaluation of water or MEK resistance (rub tests): The amine modified acrylated epoxynovolaks(after complete neutralization with acetic acid, if needed to assure water solubility) were drawn down on glass plates with a glass rod and subjected to the appropriate heating schedules. At the end of the heating period, the plates were allowed to cool to room temperature and the resistance to water or 2-butanone (or, methylethyl ketone, "MEK") determined by wetting a cotton rag with the solvent, wrapping the wet rag around the index finger, and rubbing the covered finger over the dried film surface, applying a light but firm pressure. The rag was rewetted with the solvent as necessary to keep it moist throughout the test. The number of a full sweep back and forth were counted as one rub and the number of rubs to break through the film to the glass surface were recorded.

Evaluation of Resins for Photoimaging capability: A 2 g sample of the appropriate amine modified resin which has further been acidified with acetic acid was mixed with 0.1 g each of Irgacure 651 (photoinitiator available from Ciba, Ardsley, N.Y.) and Benzophenone initiators and warmed gently until dissolution. The resulting solution was drawn down over a copper foil laminate and the coated foil dried at 65° C. for 30–60 minutes in a forced air oven. The resulting tack free coated laminate was exposed with 250 mj/$cm^2$ radiation using a Calibrated Co-light UV printer under vacuum. The exposed lamiate was then immersed in water with occational shaking for 5–10 minutes, followed by rinsing with water and drying in air followed by 60 minutes at 150° C. in a forced air drying oven. The quality of image and cured films were determined through microscopic inspection and testing as appropriate.

EXAMPLE 1

Morpholine, N-(2-Hydroxyethyl)piperizine (HEPIP) and Diethanolamine (DEA) were reacted with an equivalent amount of acrylic acid and the resulting adduct was reacted with Epon 164, an epoxy functional crosol novolak with an average functionality of 6 (available from Shell Chemical Co., Houston, Tex.) in a 1:1 epoxy-acid stoichiometry. The amine adduct was used as an internal base catalyst for the reaction. Table 1 summarizes the water solubility of the resins and the effect of heat on that property.

TABLE 1

| | Water solubility of Amine-modified Cresol Novolak Resin | | | | | |
|---|---|---|---|---|---|---|
| | | | Bake @ 150° C. (300° F.) | | | |
| | Solubility | | 30 min. | | 60 min. | |
| Amine | $H_2O$ | $H_2O$/ AcOH | $H_2O$ rub | MEK rub | $H_2O$ rub | MEK rub |
| Morphln | − | + | 100+ | 20 | 100+ | 10 |
| HEPIP | + | | 100+ | 100+ | 100+ | 100+ |
| DEA | − | + | 100+ | 9 | 100+ | 30 |

The morpholine and DEA adducts were insoluble in water, but dissolved readily after acidification with acetic acid, forming a clear, yellow solution. Surprisingly, the HEPIP adduct was soluble in water even before neutralization. The solutions were drawn down on clean glass plates and then baked at 150° C. in an attempt to reverse the Michael addition of the amine, the effect being judged by the resistance of the film to the number of double finger rubs with a rag wetted with water (water rubs) and 2-butanone (MEK rubs). The results from the morpholine and the DEA adducts show that after 30 minutes the films became water resistant as evidenced by high water rub numbers. The low MEK rub numbers suggest that the film was not crosslinked. Further, when morpholine and DEA-based samples were spiked with a peroxide crosslinking initiator, the MEK rum numbers increased to 100+. This is strong evidence for a reversal of the Michael addition of the amines as the primary process under these conditions. HEPIP results were again different, leading to a significant crosslinking of the film.

Thermally reversible aqueous solubilization of acrylic functional hydrophobic resins through addition of secondary amines followed by acid neutralization (if needed) appears feasible. The most promising amine, HEPIP, solubilized epoxycresol novolak without neutralization and also went further unassisted crosslinking at temperatures typical for thermal cure.

EXAMPLE 2

To determine the level of amine modification necessary for water solubilization of a typical acrylate resin, Morpholin, HEPIP and DEA derivatives of Epon 164 were prepared with 25, 50 and 75% of the available acrylic groups modified. The results are summarized in Table 2.

At least 50% modification followed by neutralization was necessary with morpholine and DEA to impart water solubility to Epon 164. Results with HEPIP were still different and intriguing, solubilizing without neutralization at a level of only 25% modification. HEPIP modified resins also retained their unassisted crosslinking capability at 150° C. at all modification levels.

EXAMPLE 3

To be a viable component in a contact printable liquit photo-imageable solder mask (LPI), the resin must endure a thermal drying process to a tack free state without significant crosslinking. These traits are needed to allow the material to be applied to a surface, overlaid with an image, exposed to light, and then developed. Significant crosslinking during the drying step will interfere with development step. To determine whether a resin of the present invention might be a candidate for this use, the drawn films from the water soluble compositions of Example 2 were baked for 30 and 60 minutes at 75, 65 and 60° C. (167, 149 and 140° F.). The results are shown in Table 3.

TABLE 2

Amine Modification Level for Water Solubility

| | | | Solubility | | Bake @ 150° C. (300° F.) | | | |
| | | | | | 30 min. | | 60 min. | |
| Exp* | Amine | Amine/ AA | Water | H$_2$O/ AcOH | H$_2$O rub | MEK rub | H$_2$O rub | MEK rub |
| --- | --- | --- | --- | --- | --- | --- | --- | --- |
| 18124-75 | Morphln | 1.00 | − | + | 100+ | 20 | 100+ | 10 |
| 18124-96 | Morphln | 0.75 | − | + | 100+ | 7 | 100+ | 40 |
| 18124-98 | Morphln | 0.50 | − | − | 100+ | 4 | 100+ | 36 |
| 18124-100 | Morphln | 0.25 | − | − | 100+ | 7 | 100+ | 7 |
| 18124-65 | HEPIP | 1.00 | + | | 100+ | 100+ | 100+ | 100+ |
| 18124-86 | HEPIP | 0.75 | + | | 100+ | 100+ | 100+ | 100+ |
| 18124-84 | HEPIP | 0.50 | + | | 100+ | 100+ | 100+ | 100+ |
| 18124-82 | HEPIP | 0.25 | + | | 100+ | 100+ | 100+ | 100+ |
| 18124-71 | DEA | 1.00 | − | + | 100+ | 9 | 100+ | 30 |
| 18124-33 | DEA | 0.75 | − | + | 100+ | 2 | 100+ | 100+ |
| 18124-90 | DEA | 0.50 | − | − | 100+ | 20 | 100+ | 40 |
| 18124-88 | DEA | 0.25 | − | − | 100+ | 12 | 100+ | 6 |

*All morpholine and DEA samples neutralized with acetic acid before draw-down.

TABLE 3

Drying of Tack-Free Amine Modified Acrylated Epoxy Novolak

| | | Solubility | | | Baking Schedule | | | | | |
|---|---|---|---|---|---|---|---|---|---|---|
| | | | | | 75° C./60 min | | | | | |
| Amine | Amine/AA | H$_2$O | H$_2$O/AcOH | H$_2$O rub | 75° C./30 min | 65° C./60 min | 65° C./30 min | 60° C./60 min | 60° C./30 min |
| Morph | 1.00 | − | + | 2 | 2 | 1 | 2 | 1 | 1 |
| Morph | 0.75 | − | + | 10 | 2 | 28 | 18 | 27 | 20 |
| HEPIP | 1.00 | + | | 3 | 2 | 4 | 3 | 4 | 2 |
| HEPIP | 0.75 | + | | 12 | 2 | 3 | 2 | 2 | 2 |
| HEPIP | 0.50 | + | | 2 | 2 | 5 | 3 | 3 | 3 |
| HEPIP | 0.25 | + | | 81 | 10 | 5 | 1 | 2 | 2 |
| DEA | 1.00 | − | + | 1 | 2 | 2 | 1 | 1 | 1 |
| DEA | 0.75 | − | + | 4 | 3 | 4 | 3 | 1 | 1 |

All films were tack free out of the oven after 30 minutes at all three temperatures. This was encuraging since a corresponding waterborne composition would be expected to dry at a similar rate, potentially reducing the tack dry cycle time and the operating temperature. All films also retained their water solubility after drying under these conditions, as indicated by their very low water rub numbers. This indicates that they should be water developable after imaging following the tack drying step. The HEPIP modified (0.25%) sample was somewhat more reactive than others, consistent with the general trend of higher thermal reactivity with HEPIP modified samples. However, the results from drying at lower temperatures also indicated that the reactivity was enhanced by the presence of available free acrylate groups. It was clear that the resins modified with HEPIP was undergoing further thermal reactions under relatively mild conditions.

EXAMPLE 4

Formaldehyde-free baking enamels are desirable for many purposes. To determine whether a resin of the present invention might be a candidate for this use, the water soluble compositions of Example 2 were were spiked with initiators and initiator blends, and drawn films were prepared as in Example 2, then baked for 30 and 60 minutes at 150° C. (300° F.). The results are shown in Table 4.

TABLE 4

Photocuring Water Soluble Epoxy Novolaks

| | | | | | Bake @ 150° C. (300° F.) | | | |
|---|---|---|---|---|---|---|---|---|
| | | | | | 30 min | | 60 min | |
| Amine | Amine/AA | Irg 651 | Benzoph. | Cumene HP | Vazo 52 | H$_2$O rub | MEK rub | H$_2$O rub | MEK rub |
| Morph | 1.00 | | | + | | 100+ | 10 | 100+ | 50 |
| Morph | 1.00 | | | | + | 100+ | 3 | 100+ | 100+ |
| Morph | 0.75 | + | | | | 100+ | 15 | 100+ | 100+ |
| Morph | 0.75 | + | + | | | 100+ | 8 | 100+ | 85 |
| HEPIP* | 0.75 | + | | | | | | | |
| HEPIP | 0.75 | + | + | | | | | | |
| HEPIP | 0.50 | + | | | | | | | |
| HEPIP | 0.50 | + | + | | | | | | |
| HEPIP | 0.25 | + | | | | | | | |
| HEPIP | 0.25 | + | + | | | | | | |
| DEA | 1.00 | | | + | | 100+ | 11 | 100+ | 100+ |
| DEA | 1.00 | | | | + | 100+ | 5 | 100+ | 100+ |
| DEA | 0.75 | + | | | | 100+ | 5 | 100+ | 100+ |
| DEA | 0.75 | + | + | | | 100+ | 6 | 100+ | 80 |

*All samples cured without heating: rub numbers of 100+ are omitted to highlight results for other amines.

The samples containing HEPIP, which have been shown to crosslink on their own, again crosslinked with the addition of initiators, and required no baking step. These materials are suitable for use as a baking enamel without use of an initiator. The samples containing morpholine required an initiator to crosslink, and the samples containing morpholine and DEA showed true baking enamel behavior when spiked with a hydroperoxide.

EXAMPLE 5

A fully acrylated epoxynovolak resin (derived from Epon 164) with 25–30% of the available acrylate groups modified with HEPIP was dried to a clear, track free but non-crosslinked fully reactive film in 30–60 minutes at 140–170° F. (60–76° C.). The samples of the dried, clear film, when incorporating hydroxyacetophenone (Irgacure 651) and benzophenone initiators, imaged at 250 mj/cm$^2$ in a Colight printer and developed with water to an image with 1×1 mil resolution.

EXAMPLE 6

Oxidized DMEA-MA-Acrylic-Epon 164 resins were prepared (derived from Epon 164) with appropriate amounts of DMEA-MA/Acrylic Acid to yield samples with 75:25, 50:50, 35:65, 25:75 and 10:90 epoxy:carbonyl stoichiometry. The samples were dried to clear, tack free but non-crosslinked fully reactive films in 30–60 minutes at 140–170° F. (60–76° C.). The samples of the dried, clear film, when incorporating hydroxyacetophenone (Irgacure 651) and benzophenone initiators, imaged at 250 mj/cm$^2$ in a Colight printer and developed with water to an image with 1×1 mil resolution.

What is claimed is:

1. A one-component coating compostition comprising a water removable oligomer having reversibly latent acrylate unsaturation wherein the oligomer is a beta-dialkyl amino carboxylate.

2. The composition of claim 1, wherein the beta-dialkyl amino carboxylate is a derivative where the amine is selected from the group consisting of hydroxyethylpiperizine, morpholine, or diethanolamine.

3. The composition of claim 1 wherein the oligomer has a backbone that is selected from the group consisting of urethane, polyether, polyester, acrylated epoxy bisphenol-A, and epoxy novolak resins.

4. A method of making a resin suitable for use in a water removable, curable coating, comprising modifying a hydrophobic acrylate resin with one or more thermally labile groups selected from the group consisting of beta-carboxy alkyl di- or tri-alkylamines or their salts.

5. The method of claim 4 wherein the hydrophobic acrylate resin is selected from the group consisting of urethane, polyether, polyester, and epoxy novolak resins.

6. The method of claim 4 wherein the resin is an acrylated epoxy phenol novolak resin.

7. The method of claim 4, wherein the resin is an acrylated epoxy cresol novolak resin.

8. The method of claim 4, wherein the resin is an acrylated epoxy bisphenol-A resin.

9. The method of claim 4, wherein the resin is reacted with the thermally labile groups in a mole ratio of 1:1–9:1 equivalents of acrylic unsaturation:equivalents of modifying group.

10. A water developable, one-component solder mask composition comprising an oligomer having reversibly latent acrylate unsaturation wherein the oligomer is a beta-dialkyl amino carboxylate.

11. The composition of claim 10, wherein the oligomer resin is selected from the group consisting of acrylated epoxy bisphenol-A and epoxy novolak resins.

12. The composition of claim 10, wherein the oligomer resin has a backbone that is selected from the group consisting of urethane, polyether, and polyester resins.

13. The composition of claim 10 wherein the oligomer is a beta-dialkyl amino carboxylate derived from an epoxy novolak resin and a trialkylammonium salt from a trialkylamino acid.

14. The composition of claim 10, wherein the oligomer is the half-ester of maleic acid and a dialkylamino alcohol.

15. The composition of claim 14, wherein the oligomer is the half-ester of maleic acid and dimethylamino ethanol.

16. The composition of claim 15 wherein the epoxy novolak resin is reacted with the trialkylammonium salt in a mole ratio of 1:1 to 9.9:1 equivalents of acrylic unsaturation to equivalents of modifying group.

17. The composition of claim 15 wherein the epoxy novolak resin is reacted with the trialkylammonium salt in a mole ratio of 1:1 to 9:1 equivalents of acrylic unsaturation to equivalents of modifying group.

18. The composition of claim 15 wherein the beta-dialkylamino carboxylate is further oxidized to the corresponding amine oxide.

19. The composition of claim 16 further comprising one or more photoinitiators, thermal initiators, or blends thereof.

20. A method of making a permanent protective coating for a printed circuit board, the steps comprising applying to a laminate having a circuit pattern thereon, a composition comprising a water soluble oligomer having reversibly latent acrylate unsaturation wherein the oligomer is a beta-dialkyl amino carboxylate, drying the coating curing at least a portion of the coating by exposing the coating to UV light at an energy level of at least about 50–1,000 mJ/cm$^2$ using an image, developing the coating with an aqueous wash, and subjecting the coating to thermal curing conditions at about 120–170° C.

21. A water removable, one-component, thermally curable composition comprising an oligomer having reversibly latent acrylate unsaturation, wherein the oligomer is selected from the group consisting of hydrophobic resins with pendent acrylate groups and further modified with one or more thermally labile groups, wherein the thermally labile group is a beta-carboxy alkyl trialkylamine salt where the amine is selected from the group consisting of hydroxyethylpiperizine, morpholine, or diethanolamine.

22. The composition of claim 21, wherein the oligomer backbone is selected from the group consisting of urethane, polyether, polyester, and novolak resins.

23. The composition of claim 22, wherein the resin is an acrylated epoxy phenol novolak resin.

24. The composition of claim 22, wherein the resin is an acrylated epoxy cresol novolak resin.

25. The composition of claim 22, wherein the resin is an acrylated epoxy bisphenol-A resin.

26. The composition of claim 21, further comprising one or more initiators.

27. The composition of claim 21 that is formaldehyde-free.

* * * * *